(12) United States Patent
Tsou

(10) Patent No.: US 7,829,895 B2
(45) Date of Patent: Nov. 9, 2010

(54) PIXEL STRUCTURE AND REPAIRING METHOD THEREOF

(75) Inventor: Yuan-Hsin Tsou, Padeh (TW)

(73) Assignee: Chunghwa Picture Tubes, Ltd., Taoyuan (TW)

( * ) Notice: Subject to any disclaimer, the term of this patent is extended or adjusted under 35 U.S.C. 154(b) by 591 days.

(21) Appl. No.: 11/892,901

(22) Filed: Aug. 28, 2007

(65) Prior Publication Data
US 2008/0067518 A1 Mar. 20, 2008

(30) Foreign Application Priority Data
Sep. 15, 2006 (TW) .............................. 95134278 A

(51) Int. Cl.
*H01L 29/40* (2006.01)
*G02F 1/1343* (2006.01)
(52) U.S. Cl. .................. 257/72; 257/E29.112; 438/4; 349/139; 349/192
(58) Field of Classification Search .................. 257/59, 257/72, E29.111, E29.112; 345/55, 92, 93; 349/84, 139, 184; 438/4
See application file for complete search history.

(56) References Cited

U.S. PATENT DOCUMENTS

| | | | |
|---|---|---|---|
| 5,546,207 A | 8/1996 | Kim | |
| 5,855,955 A | 1/1999 | Claar et al. | |
| 6,259,494 B1 * | 7/2001 | Kawai et al. | 349/39 |
| 6,476,882 B1 * | 11/2002 | Sakurai | 349/55 |
| 6,646,694 B2 | 11/2003 | Lee | |
| 6,717,634 B2 | 4/2004 | Kim et al. | |
| 6,820,992 B2 | 11/2004 | Yu et al. | |
| 6,833,882 B2 | 12/2004 | Lee | |
| 6,839,096 B1 | 1/2005 | Jeong et al. | |
| 6,908,780 B2 | 6/2005 | Lai | |
| 7,427,777 B2 * | 9/2008 | Tsou et al. | 257/59 |
| 2003/0072146 A1 | 4/2003 | Yu et al. | |

FOREIGN PATENT DOCUMENTS

TW 514986 B 12/2002

\* cited by examiner

*Primary Examiner*—Lynne A Gurley
*Assistant Examiner*—Andrew O Arena
(74) *Attorney, Agent, or Firm*—Muncy, Geissler, Olds & Lowe, PLLC

(57) ABSTRACT

The pixel structure and the repairing method of the TFT array substrate are provided. The pixel has a semiconductor electrode which is partially overlapped with a floating metal located in the first conductive layer. Both the data line and the drain electrode have protruded regions partially overlapped with the semiconductor electrode and the floating metal. Once the pixel is found to be a white defect, a laser beam is used to irradiate the protruded region of the data line to electrically connect the data line and the floating metal and so as to form a diode structure having the rectified effect. Consequently, after the laser repair, the pixel defect will display as the non-flicked white point and black point in the white-picture inspection and the black-picture inspection respectively.

20 Claims, 7 Drawing Sheets

PIXEL STRUCTURE AND REPAIRING METHOD THEREOF

BACKGROUND OF THE INVENTION

1. Field of the Invention

The present invention relates to a pixel structure, and more particularly, to a pixel structure of a Thin Film Transistor (TFT) array substrate and a repairing method thereof.

2. Description of the Prior Art

The Thin Film Transistor-Liquid Crystal Display (TFT-LCD) is the most popular Flat Panel Display (FPD) recently. It has many benefits such as its low power consumption, thin shape, light weight, and low driving voltage, etc.

It is known that the TFT-LCD has been developed towards to the application field of television in recent years, so the display panel has been promoted to the large-scale design. Consequently, the fabrication process is becoming more and more complex and difficult. It is hard to consider the influence of both the constraint conditions and the process errors on the display quality at the same time although there are other key factors to affect the productivity and the yield.

The display region of a TFT array substrate contains a plurality of pixels arranged in matrix. A pixel is defined by the crossing of two scan lines and two data lines. In addition to a pixel electrode, there are a TFT element and a storage capacitor contained in the pixel. The TFT is a switching element and its on-off state is controlled by both gate signals from the scan line and source signals from the data line. A storage capacitance line is provided in the pixel to form a capacitor that can maintain the present pixel signal of the pixel electrode until the subsequent signal is applied thereto.

During the fabrication process of the TFT array, it is liable to be damaged and resulted in an abnormal short-circuit or open-circuit by several factors such as the static electricity and the unexpected particle pollution. The dot defect of the pixel can be distinguished as several kinds such as the white defect and the black defect, etc. In order to assure the display quality, normally the black-picture inspection and the white-picture inspection will be executed to find the dot defect of the pixel after the completion of the substrate for the TFT array and the color filter. Since the white defect is always bright in the black inspection, which human eyes are very sensitive to recognize. Generally, a laser repairing process will be adopted when just a few white defects are found in the black-picture inspection.

A partial top-view schematic diagram of a pixel with the conventional laser repairing structure in the TFT array substrate is illustrated in FIG. 1A. A Data line 114 transmits a source signal to a source electrode 100, wherein the data line 114, the source electrode 100 and a drain electrode 106 are located in the second conductive layer. A scan line 104 transmits a gate signal, wherein the scan line 104 is located in the first conductive layer on a substrate. A storage capacitance line 110 formed with the first conductive layer in the pixel is provided to transmit the common voltage ($V_{com}$). The semiconductor electrode 102 is partially covered by the source electrode 100 and partially covered by the drain electrode 106. A contact hole 108 is used to electrically connect the pixel electrode 112 and the drain electrode 106.

Once the pixel is found to be a white defect in the black-picture inspection, the laser beam is used to irradiate the overlapped region 118 of the drain electrode 106 and the scan line 104 so as to electrically connect the drain electrode 106 and the scan line 104. Because the pixel electrode 112 and the drain electrode 106 are electrically connected, the electrical voltage of the pixel electrode 112 is equal to the electrical voltage of the gate electrode after the laser repair.

The electrical voltage of the gate electrode is alternated between the high-level voltage ($V_{gh}$) and the low-level voltage ($V_{gl}$). Further, absolute values of the voltage difference between $V_{gh}$, $V_{gl}$ and $V_{com}$ are bigger than the $V_{com}$ so as the repaired pixel will always display as a dark defect.

For example, FIG. 1B is to illustrate the electrical voltage of the repaired pixel. $V_{gh}$, $V_{gl}$ and $V_{com}$ are respectively equal to 24V, −6V, and 4V. The absolute value of the voltage difference between $V_{gh}$ and $V_{com}$, and $V_{gl}$ and $V_{com}$ are respectively $V_{d1}$ and $V_{d2}$. $V_{d1}$ and $V_{d2}$ are respectively equal to 20V and 10V. Thus, both $V_{d1}$ and $V_{d2}$ are bigger than $V_{com}$. Therefore, the repaired pixel will display as a dark defect so as to achieve the repair purpose for the white defect.

This kind of laser repairing structure and method for repairing a white defect eliminates the drawback of being bright for a pixel permanently. Nevertheless, it will display as an obvious dark point in the white-picture inspection so as to degrade the display quality of the TFT-LCD panel.

FIG. 2A is another partial top-view schematic diagram of a pixel with the conventional laser repairing structure in the TFT array substrate. A Data line 214 transmits a source signal to a source electrode 200, wherein the data line 214, the source electrode 200 and a drain electrode 206 are located in the second conductive layer. A scan line 204 transmits a gate signal, wherein the scan line 204 is located in the first conductive layer on a substrate. A storage capacitance line 210 formed with the first conductive layer in the pixel is provided to transmit the common voltage ($V_{com}$). The semiconductor electrode 202 is partially covered by the source electrode 200 and partially covered by the drain electrode 206. A contact hole 208 is used to electrically connect the pixel electrode 212 and the drain electrode 206. One floating metal conductor 216 formed with the first conductive layer is prepared for the laser repair in necessity. The floating metal conductor 216 is respectively partially overlapped with the data line 214 and the drain electrode 206 at the overlapped regions 218 and 220.

Once the pixel is found to be a white defect in the black-picture inspection, the laser beams can be used to irradiate the overlapped regions 218 and 220 from the lower surface side of the substrate to electrically connect the data line 214 with the floating metal 216 and to electrically connect the drain electrode 206 with the floating metal 216. Thus, the data line 214 and the drain electrode 206 are electrically connected through the floating metal 216. Then, the source signal can directly transmit to the pixel electrode 212 through the contact hole 208 to convert the white defect into a gray defect so as to achieve the repair purpose for the white defect.

However, the gray defect will flick owing to the alternation of the positive-negative polarities in both the black-picture inspection and the white-picture inspection.

The electrical voltages of the repaired pixel are illustrated in FIG. 2B and FIG. 2C. FIG. 2B is to illustrate the alternation of the positive-negative polarities in the black-picture inspection. The source signal is alternated between the high-level voltage ($V_{sh}$) and the low-level voltage ($V_{sl}$). The $V_{sh}$, $V_{sl}$ and $V_{com}$ are respectively equal to 8V, 0V and 4V. Voltage differences between $V_{sh}$ and $V_{com}$, and $V_{sl}$ and $V_{com}$ are respectively $V_{d3}$ and $V_{d4}$. $V_{d3}$ and $V_{d4}$ are respectively equal to 4V and −4V. Thus, the gray point will flick owing to the alternation of the positive-negative polarities.

FIG. 2C is to illustrate the alternation of the positive-negative polarities in the white-picture inspection. The source signal is alternated between the high-level voltage ($V_{sh}$) and the low-level voltage ($V_{sl}$). $V_{sh}$, $V_{sl}$ and $V_{com}$ are respectively equal to 5V, 3V and 4V. Voltage differences between $V_{sh}$ and $V_{com}$, and $V_{sl}$ and $V_{com}$ are respectively $V_{d5}$ and $V_{d6}$. $V_{d5}$ and $V_{d6}$ are respectively equal to 1V and −1V. Thus, the gray point will flick owing to the alternation between the positive-negative polarities.

Therefore, this kind of laser repairing structure and method for repairing white defect is free of the drawback of being always bright or always dark for a pixel. However, it will make the pixel flick when the positive-negative polarity of the source signal is changing, and so as to degrade the display quality of the TFT-LCD panel.

SUMMARY OF THE INVENTION

In order to solve the aforementioned problem of being displayed as an obvious dark point in the white-picture inspection after repairing a white defect by converting it to a black defect, the present invention provides pixel structures and repairing methods thereof. After the laser beam, the white defect will display as the non-flicked white point and non-flicked black point in the white-picture inspection and the black-picture inspection respectively.

Consequently, the pixel structure and the repairing method thereof of the present invention can effectively elevate the repair yield and quality.

To achieve the above-mentioned and other objects, one embodiment of the present invention is to provide a pixel structure and a repairing method thereof. The pixel has a semiconductor electrode partially overlapped with a floating metal located in the first conductive layer. Both the data line and the drain electrode have the protruded regions partially overlapped with the semiconductor electrode and the floating metal. Once the pixel is found to be a white defect, a laser beam is used to irradiate the protruded region of the data line from the lower surface side of the substrate to electrically connect the data line and the floating metal and so as to form a diode structure having the rectified effect. Consequently, after the laser repair, the white defect will display as the non-flicked white point and the non-flicked black point in the white-picture inspection and the black-picture inspection respectively.

BRIEF DESCRIPTION OF THE DRAWINGS

The foregoing aspects and many of the accompanying advantages of this invention will become more readily appreciated as the same becomes better understood by reference to the following detailed description, when taken in conjunction with the accompanying drawings, wherein.

DESCRIPTION OF THE PREFERRED EMBODIMENT

Figure 1A:
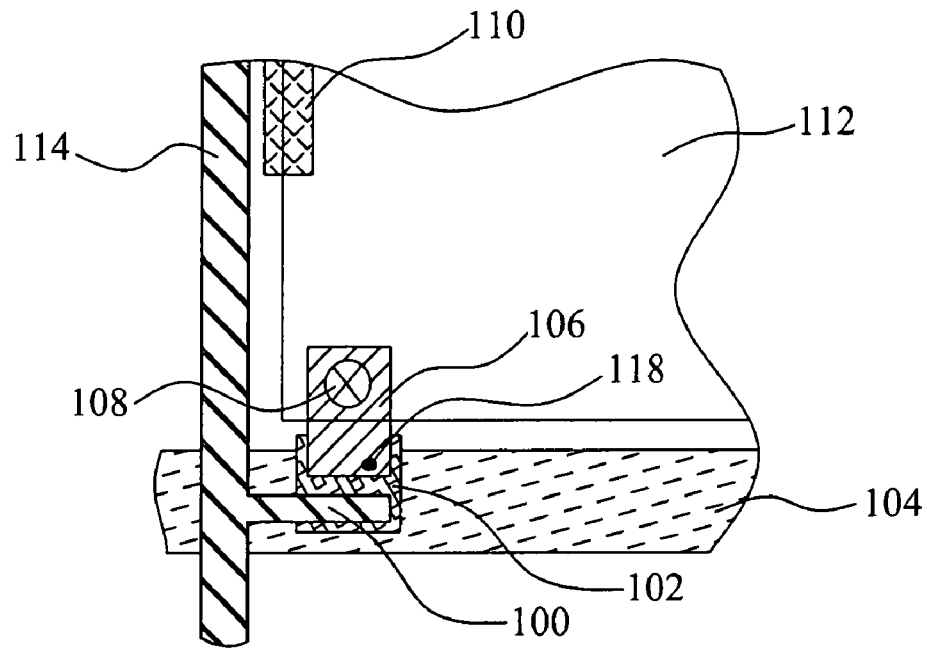
FIG. 1A is a partial top-view schematic diagram of a pixel with the conventional laser repairing structure according to one prior art of the present invention.
Figure 1B:
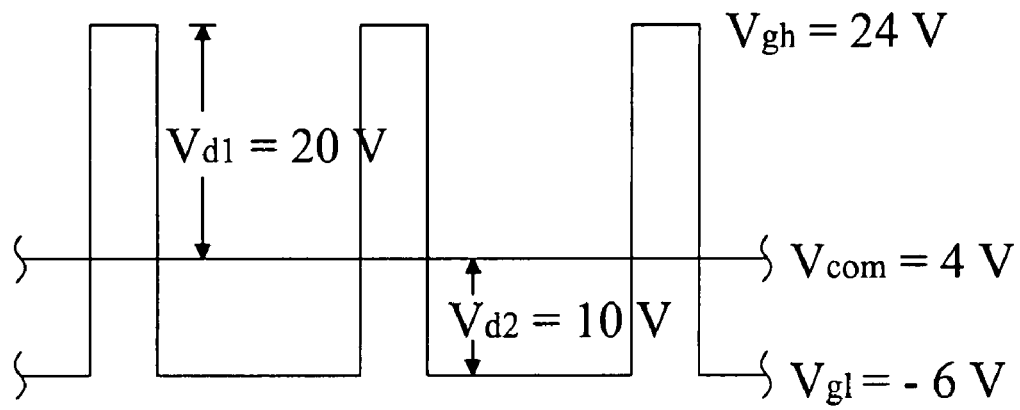
FIG. 1B is to illustrate the electrical voltages of a repaired pixel according to one prior art of the present invention.
Figure 2A:
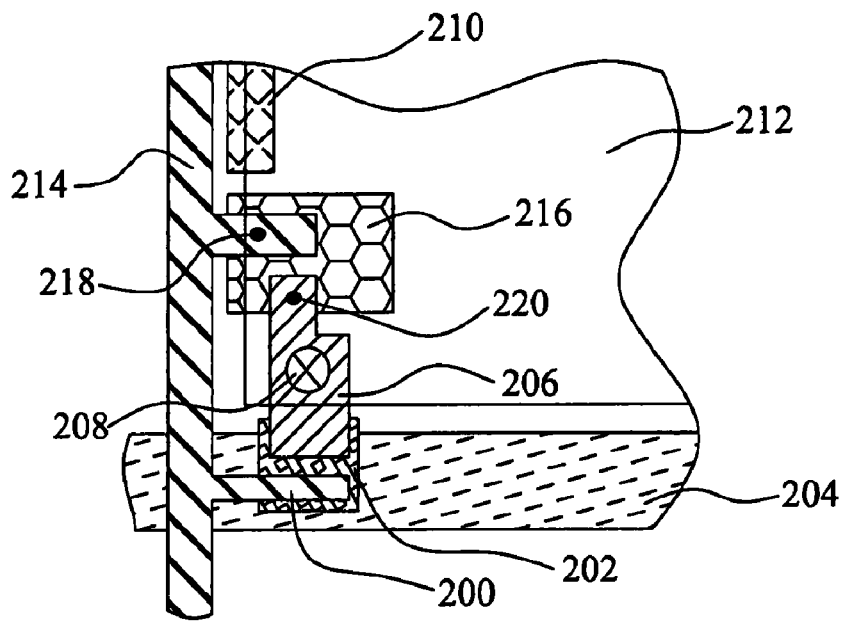
FIG. 2A is a partial top-view schematic diagram of a pixel with the conventional laser repairing structure according to one prior art of the present invention.
Figure 2B:
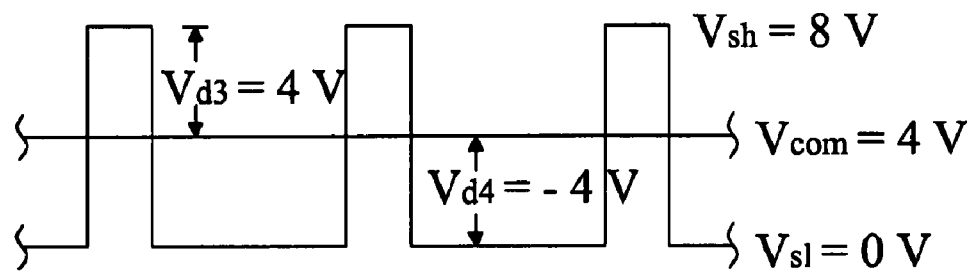
FIG. 2B is to illustrate the alternation of the positive-negative polarities in the black-picture inspection according to one prior art of the present invention.
Figure 2C:
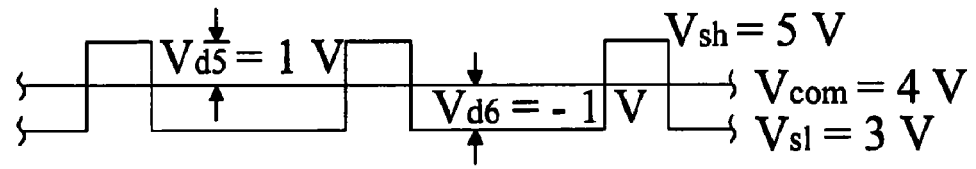
FIG. 2C is to illustrate the alternation of the positive-negative polarities in the white-picture inspection according to one prior art of the present invention.
Figure 3A:
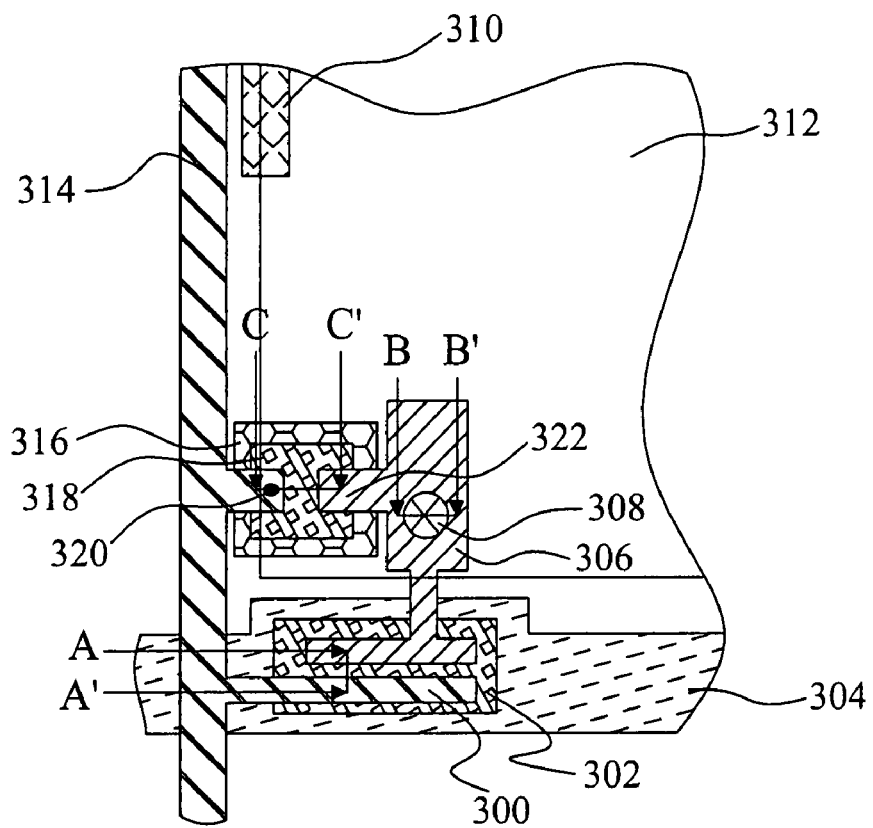
FIG. 3A is a partial top-view schematic diagram of a pixel with the laser repairing structure according to the first embodiment of the present invention.

FIG. 3A is a partial top-view schematic diagram of a pixel with the laser repairing structure according to the first embodiment of the present invention. The TFT array substrate is a multi-layer structure having two conductive layers: the first conductive layer and the second conductive layer. The first conductive layer comprises a scan line 304, a storage capacitance line 310, and a first floating metal 316. The scan line 304 extends in a row direction, and the storage capacitance line 310 is to transmit a common voltage $V_{com}$. The second conductive layer comprises a data line 314, a source electrode 300, and a drain electrode 306. The data line 314 transmits the source signal to the source electrode 300, and the first semiconductor electrode 302 is partially covered by the source electrode 300 and partially covered by the drain electrode 306. The scan line 304 has a portion of gate electrode (not shown in the figure) located under the first semiconductor electrode 302. The gate signal is transmitted the gate electrode by the scan line 304. A contact hole 308 is used to electrically connect the pixel electrode 312 and the drain electrode 306.

A second semiconductor electrode 318 is partially overlapped with the first floating metal 316. The data line 314 has a first protruded portion 320 partially overlapped with the second semiconductor electrode 318 and the first floating metal 316. The drain electrode 306 has a first protruded portion 322 partially overlapped with the second semiconductor electrode 318 and the first floating metal 316.

In one preferred embodiment, the material of the first conductive layer and the second conductive layer includes Al, Cu, Au, Cr, Ta, Ti, Mn, Ni, Mo, Nb, Nd, Ag or a combination thereof. And the conductive pixel electrode 312 is usually composed of indium tin oxide (ITO) or indium zinc oxide (IZO).

Figure 3B:
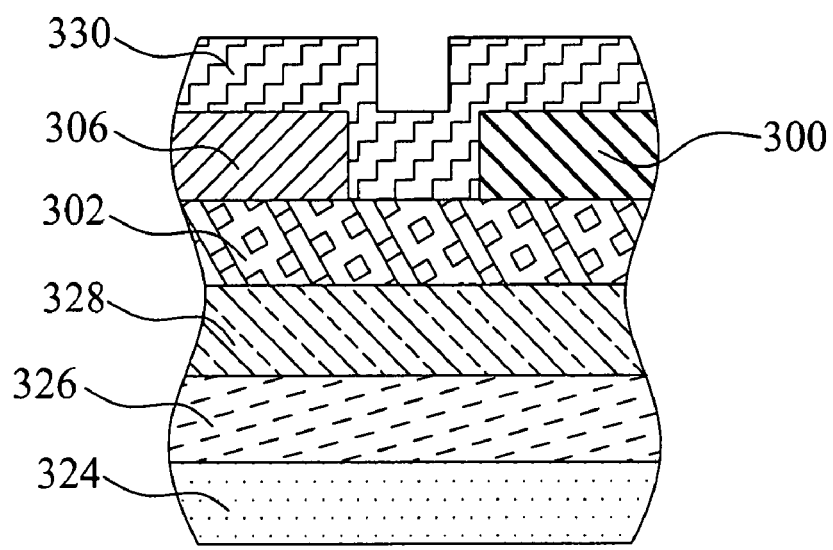
FIG. 3B is a cross-sectional schematic diagram taken from she cross-segment A-A' in FIG. 3A.

FIG. 3B is a cross-sectional schematic diagram taken from the cross-segment A-A' in FIG. 3A. A gate electrode 326 is intervened between a substrate 324 and an insulation layer 328. The material of the substrate 324 is transparent glass in one preferred embodiment. The first semiconductor electrode 302 is located on the insulation layer 328. The drain electrode 306 and the source electrode 300 are electrically insulated by the passivation layer 330. In one preferred embodiment, the material of the insulation layer 328 and the passivation layer 330 includes silicon oxide or silicon nitride.

Figure 3C:
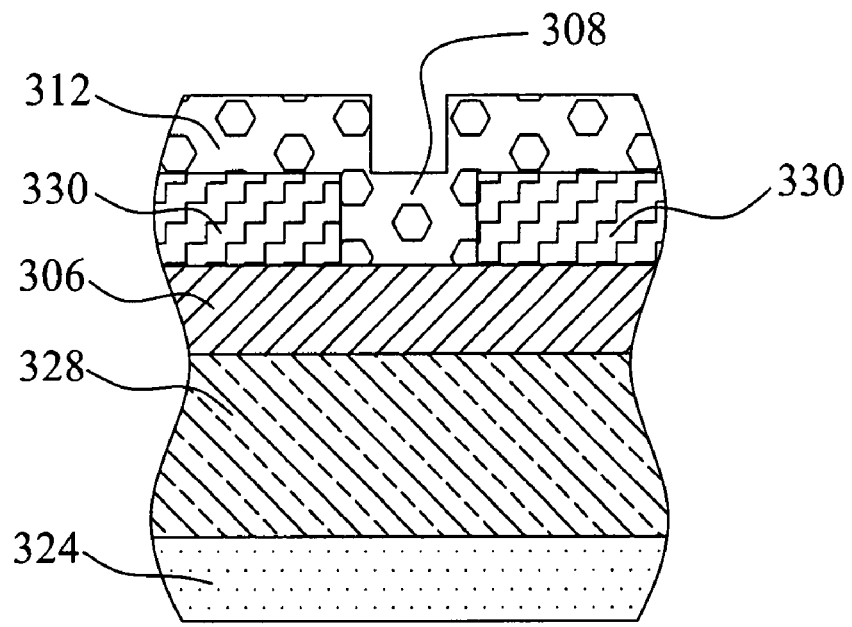
FIG. 3C is a cross-sectional schematic diagram taken from the cross-segment B-B' in FIG. 3A.

FIG. 3C is a cross-sectional schematic diagram taken from the cross-segment B-B' in FIG. 3A, a contact hole 308 is used to electrically connect the pixel electrode 312 and the drain electrode 306.

Figure 3D:
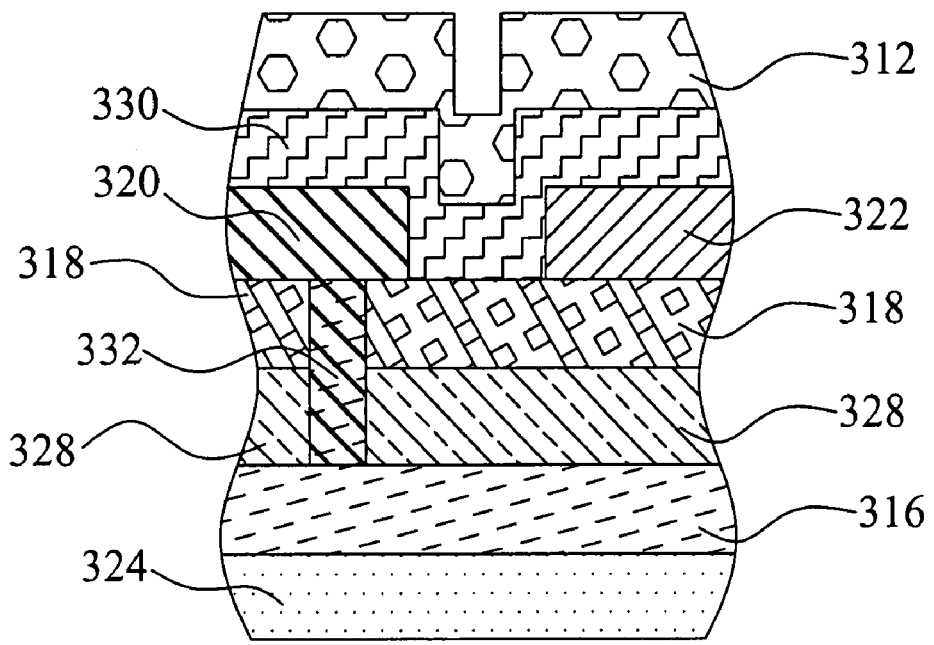
FIG. 3D is a cross-sectional schematic diagram taken from the cross-segment C-C' in FIG. 3A.

Once the pixel is found to be a white defect in the black-picture inspection, a laser beam is used to irradiate the first protruded portion 320 of the data line 314 in FIG. 3A to repair the pixel. FIG. 3D is a cross-sectional schematic diagram taken from the cross-segment C-C' in FIG. 3A to illustrate the cross-sectional structure of the first protruded portion 320 after being irradiated by the laser beam. A laser beam is irradiated from the lower surface side of the substrate 324. The first protruded portion 320 of the data line 314 and the first protruded portion 322 of the drain electrode 306 are located on the second semiconductor electrode 318 and are electrically insulated by the passivation layer 330. The first protruded portion 320 and the first floating metal 316 are electrically connected through the molten metal 332.

Figure 3E:
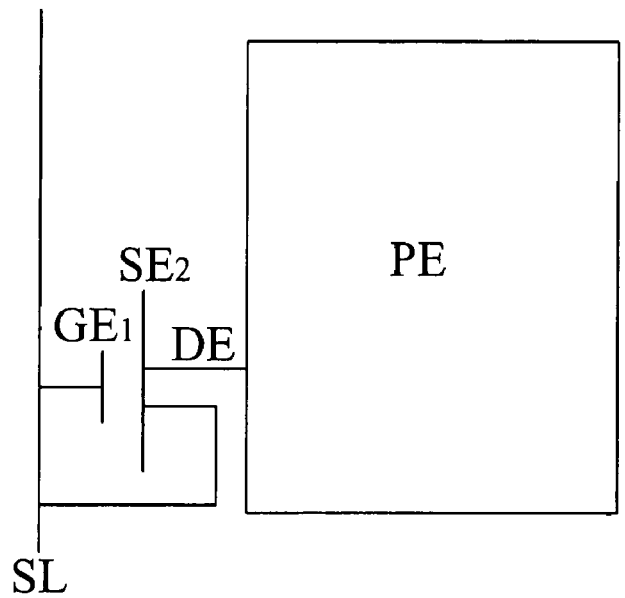
FIG. 3E is the schematic diagram of the equivalent circuit after the laser repair according to the first embodiment of the present invention.

Therefore, after the laser beam, the first floating metal 316, the second semiconductor electrode 318 and the drain electrode 306 form a diode structure connected to the data line 314. FIG. 3E is the schematic diagram of the equivalent circuit after the laser beam. SL, $GE_1$, $SE_2$, DE and PE respectively represent the data line 314, the first floating metal 316, the second semiconductor 318, the drain electrode 306 and the pixel electrode 312. This diode structure has the rectified effect.

Figure 3F:
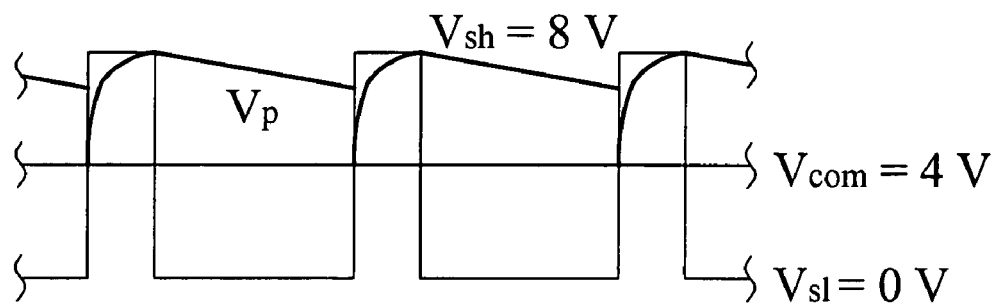
FIG. 3F is the schematic diagram of the charge-discharge waveform for the electrical voltage of the pixel electrode in the black-picture inspection after the laser repair according to the first embodiment of the present invention.

For example, FIG. 3F is the schematic diagram of the charge-discharge waveform for the electrical voltage ($V_p$) of the pixel electrode in the black-picture inspection after the laser repair. The source signal is alternated between its high-level voltage ($V_{sh}$) and low-level voltage ($V_{sl}$). $V_p$ charges in the $V_{sh}$ period and discharges in the $V_{sl}$ period. Further, $V_p$ is always larger than the common voltage $V_{com}$. In a preferred embodiment, $V_{sh}$, $V_{sl}$ and $V_{com}$ are respectively 8V, 0V and 4V.

Figure 3G:
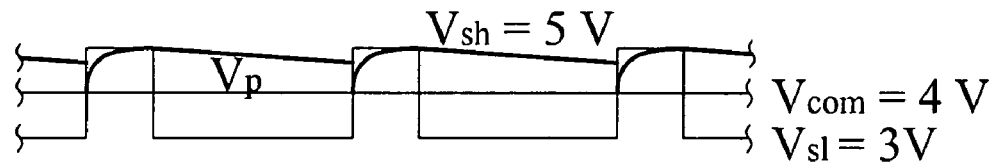
FIG. 3G is the schematic diagram of the charge-discharge waveform for the electrical voltage of the pixel electrode in the white-picture inspection after the laser repair according to the first embodiment of the present invention.

And, FIG. 3G is the schematic diagram of the charge-discharge waveform for the electrical voltage $V_p$ of the pixel electrode in the white-picture inspection after the laser repair. The source signal is alternated between its high-level voltage ($V_{sh}$) and low-level voltage ($V_{sl}$). $V_p$ charges in the $V_{sh}$ period and discharges in the $V_{sl}$ period. Further, $V_p$ is always larger than the common voltage $V_{com}$. In a preferred embodiment, $V_{sh}$, $V_{sl}$ and $V_{com}$ are respectively 5V, 3V and 4V.

Consequently, the diode structure generates the rectified effect, and so as to make the electrical voltage of the pixel electrode $V_p$ be always larger than the common voltage $V_{com}$. Accordingly, after the laser repair, the white defect will display as the white point and the black point similar to other normal pixels in the white-picture inspection and the black-picture inspection respectively. Moreover, the repaired pixel is unlike the gray defect, it will not flick.

As for the diode structure in this embodiment, the discharge process of the pixel electrode in the $V_{sl}$ period is through the reverse leakage current. The second embodiment of the present invention sets up one more diode structure than the first embodiment to make the discharge process easier by offering a discharge route in the $V_{sl}$ period for the pixel electrode.

Figure 4A:
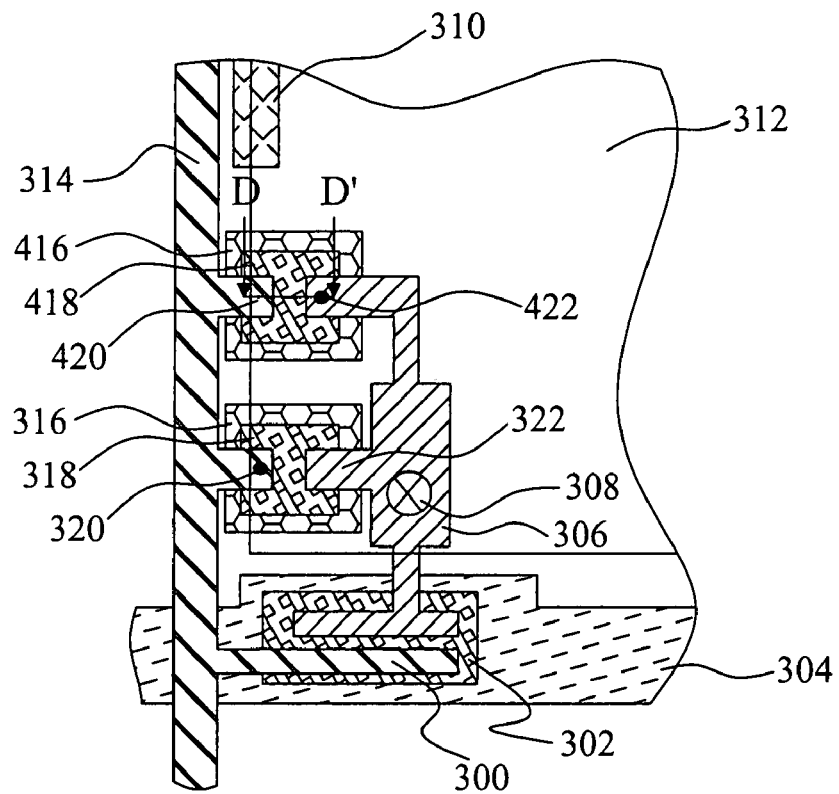
FIG. 4A is a partial top-view schematic diagram of a pixel with the laser repairing structure according to the second embodiment of the present invention.

The FIG. 4A is the top-view schematic diagram of the second embodiment. A third semiconductor electrode 418 is partially overlapped with the second floating metal 416. The data line 314 has a second protruded portion 420 partially overlapped with the third semiconductor electrode 418 and the second floating metal 416. The drain electrode 306 has a second protruded portion 422 partially overlapped with the third semiconductor electrode 418 and the second floating metal 416.

Once the pixel is found to be a white defect in the black-picture inspection, in addition to using a laser beam to irradiate the first protruded portion 320 of the data line 314 to repair the pixel, a laser beam is used to irradiate the second protruded portion 422 of the drain electrode 306.

Figure 4B:
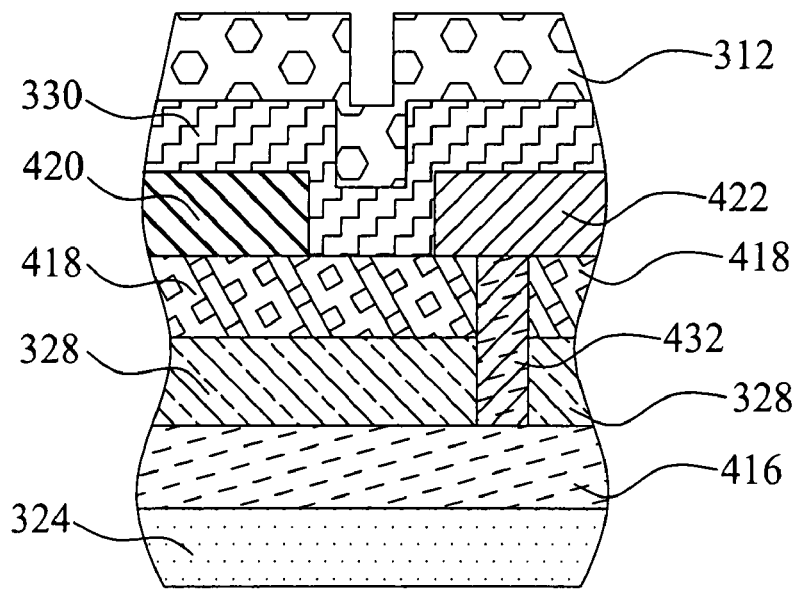
FIG. 4B is a cross-sectional schematic diagram taken from the cross-segment D-D' in FIG. 4A.

FIG. 4B is a cross-sectional schematic diagram taken from the cross-segment D-D' in FIG. 4A to illustrate the cross-sectional structure of the second protruded portion 422 after being irradiated by the laser beam. A laser beam is irradiated from the lower surface side of the substrate 324. The second protruded portion 420 of the data line 314 and the second protruded portion 422 of the drain electrode 306 are located on the third semiconductor electrode 418 and are electrically insulated by the passivation layer 330. The second protruded portion 422 and the second floating metal 416 are electrically connected through the molten metal 432.

Therefore, after the laser repair, the second floating metal 416, the third semiconductor electrode 418, and the data line 314 form a diode structure electrically connected to the pixel electrode 312.

Figure 4C:
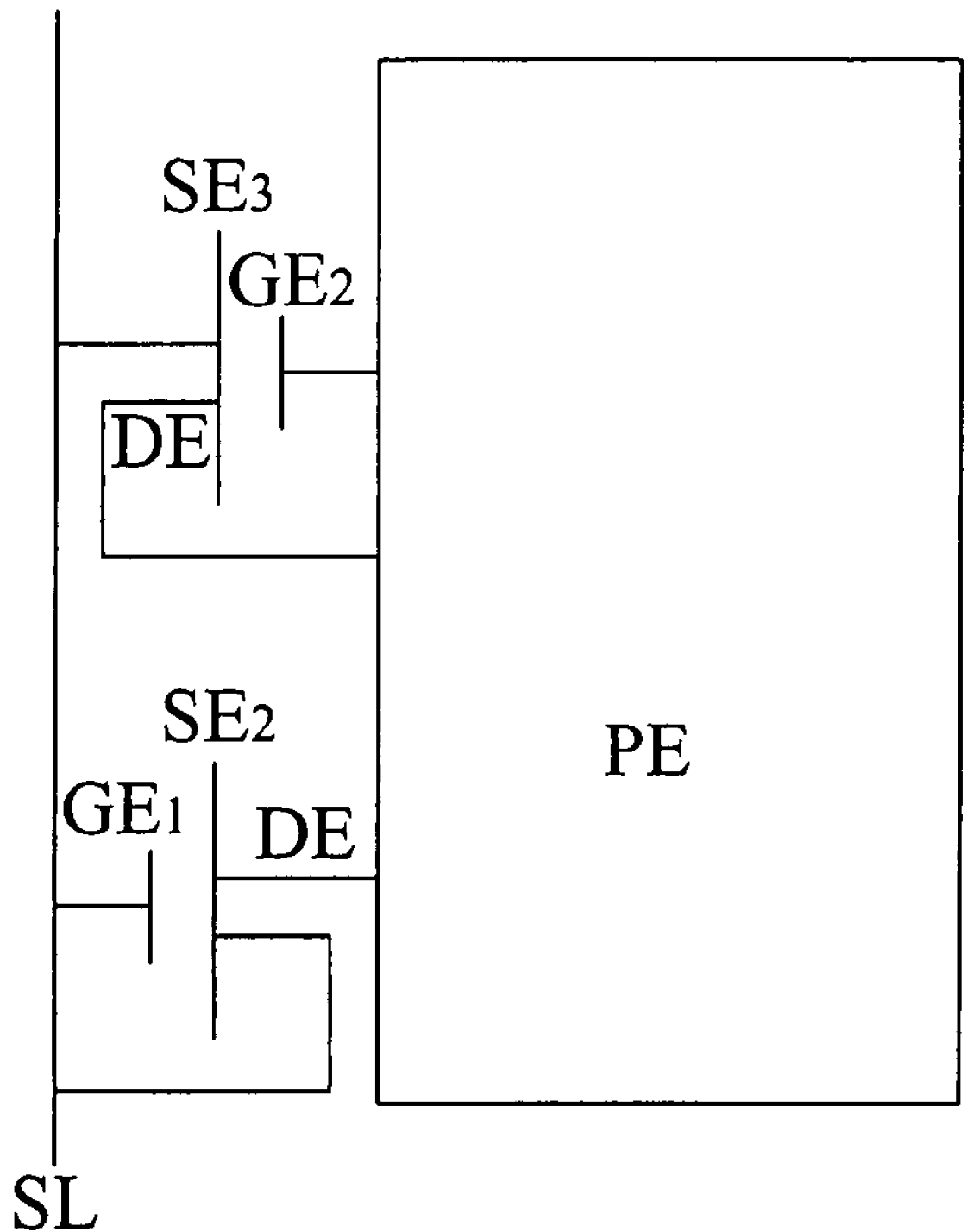
FIG. 4C is the schematic diagram of the equivalent circuit after the laser repair according to the second embodiment of the present invention.

FIG. 4C is the schematic diagram of the equivalent circuit after the laser repair. $GE_2$ and $SE_3$ respectively represent the second floating metal 416 and the third semiconductor electrode 418. Thus, $GE_1$-$SE_2$-DE forms the first diode and $GE_2$-$SE_3$-SL forms the second diode. Please referring to FIG. 3F and FIG. 3G again, the electrical voltage of the pixel electrode $V_p$ will charge in the $V_{sh}$ period through the first diode and discharge in the $V_{sl}$ period through the second diode. Accordingly, the second embodiment has one more discharge route than the first embodiment, so its discharge process is easier.

Of course, similar to the first embodiment, the repaired white defect of the second embodiment will display as the white point and the black point similar to other normal pixels in the white-picture inspection and the black-picture inspection respectively. Moreover, the repaired pixel is unlike the gray defect, it will not flick.

Consequently, the pixel structure and the method thereof to repair a white defect of the present invention can effectively elevate the repair yield and quality.

To sum up, the present invention provides the pixel structure and the repairing method thereof. The pixel has a semiconductor electrode partially overlapped with a floating metal located in the first conductive layer. Both the data line and the drain electrode have the protruded regions partially overlapped with the semiconductor electrode and the floating metal. Once the pixel is found to be a white defect, a laser beam is used to irradiate the protruded region of the data line to electrically connect the data line and the floating metal and so as to form a diode structure having the rectified effect. In addition, a single discharge route may also be implemented by setting up another symmetric diode structure. Consequently, after the laser beam, the white defect will display as the non-flicked white point and the non-flicked black point in the white-picture inspection and the black-picture inspection respectively.

The foregoing descriptions of specific embodiments of the present invention have been presented for purposes of illustrations and description. They are not intended to be exclusive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to particular use contemplated. It is intended that the scope of the invention be defined by the Claims appended hereto and their equivalents.

What is claimed is:

1. A pixel structure, comprising:
a first conductive layer disposed on a substrate, wherein the first conductive layer comprises a scan line and a first floating metal;
an insulation layer disposed on the first conductive layer;
a semiconductor layer disposed on the insulation layer and comprising a first semiconductor electrode and a second semiconductor electrode, wherein the second semiconductor electrode is partially overlapped with the first floating metal; and
a second conductive layer on the insulation layer comprising: a data line, and a drain electrode partially disposed on the first semiconductor electrode, wherein the data line has a first protruded portion partially overlapped with the second semiconductor electrode and the first floating metal, and the drain electrode has a first protruded portion partially overlapped with the second semiconductor electrode and the first floating metal.

2. The pixel structure according to claim 1, wherein the first conductive layer further comprises a storage capacitance line.

3. The pixel structure according to claim 1, wherein the second conductive layer further comprises a source electrode connected to the data line and set opposite to the drain electrode, and the source electrode is partially located on the first semiconductor and partially located on the insulation layer.

4. The pixel structure according to claim 1, wherein the first floating metal is electrically insulated from the scan line.

5. The pixel structure according to claim 1, wherein the first semiconductor electrode is separated from the second semiconductor electrode.

6. The pixel structure according to claim 1, further comprising a passivation layer disposed on the second conductive layer.

7. The pixel structure according to claim 6, further comprising a pixel electrode disposed on the passivation layer.

8. The pixel structure according to claim 7, wherein the pixel electrode is electrically connected to the drain electrode through a contact hole.

9. The pixel structure according to claim 7, wherein the material of the pixel electrode comprises indium tin oxide or indium zinc oxide.

10. A repairing method for a pixel structure, the pixel structure comprising a first conductive layer disposed on a substrate, an insulation layer disposed on the first conductive layer, a semiconductor layer disposed on the insulation layer, and a second semiconductor layer disposed on the insulation layer, wherein the first conductive layer has a scan line and a first floating metal, the semiconductor layer has a first semiconductor electrode and a second semiconductor electrode, the second semiconductor electrode being partially overlapped with the first floating metal, and the second conductive layer has a data line and a drain electrode partially disposed on the first semiconductor electrode, the data line having a first protruded partially overlaps led with the second semiconductor electrode and the first floating metal, and the drain electrode having a first protruded portion partially overlapped with the second semiconductor electrode and the first floating metal, the method comprising irradiating a laser beam to the first protruded portion of the data line from a lower surface side of the substrate to electrically connect the data line and the first floating metal.

11. A pixel structure, comprising:
a first conductive layer disposed on a substrate, wherein the first conductive layer comprises a scan line, a first floating metal, and a second floating metal;
an insulation layer disposed on the first conductive layer;
a semiconductor layer disposed on the insulation layer and comprising a first semiconductor electrode, a second semiconductor electrode and a third semiconductor electrode, wherein the second semiconductor electrode is partially overlapped with the first floating metal, the third semiconductor electrode is partially overlapped with the second floating metal; and
a second conductive layer comprising: a data line, and a drain electrode partially disposed on the first semiconductor electrode, wherein the data line has a first protruded portion partially overlapped with the second semiconductor electrode and the first floating metal and has a second protruded portion partially overlapped with the third semiconductor electrode and the second floating metal, and wherein the drain electrode has a first protruded portion partially overlapped with the second semiconductor electrode and the first floating metal and has a second protruded portion partially overlapped with the third semiconductor electrode and the second floating metal.

12. The pixel structure according to claim 11, wherein the first conductive layer further comprises a storage capacitance line.

13. The pixel structure according to claim 11, wherein the second conductive layer further comprises a source electrode connected to the data line and set opposite to the drain electrode, and the source electrode is partially located on the first semiconductor and partially located on the insulation layer.

14. The pixel structure according to claim 11, wherein the scan line, the first floating metal and the second floating metal are electrically insulated.

15. The pixel structure according to claim 11, wherein the first semiconductor electrode, the second semiconductor electrode and the third semiconductor electrode are electrically insulated from each other.

16. The pixel structure according to claim 11, further comprising a passivation layer disposed on the second conductive layer.

17. The pixel structure according to claim 16, further comprising a pixel electrode disposed on the passivation layer.

18. The pixel structure according to claim 17, wherein the pixel electrode is electrically connected to the drain electrode through a contact hole.

19. The pixel structure according to claim 17, wherein the material of the pixel electrode comprises indium tin oxide or indium zinc oxide.

20. A repairing method for a pixel structure, the pixel structure comprising a first conductive layer disposed on a substrate, an insulation layer disposed on the first conductive layer, a semiconductor layer disposed on the insulation layer, and a second conductive layer, wherein the first conductive layer has a scan line, a first floating metal, and a second floating metal, the semiconductor layer has a first semiconductor electrode, a second semiconductor electrode, and a third semiconductor electrode, the second semiconductor electrode being partially overlapped with the first floating metal and the third semiconductor electrode being partially overlapped with the second floating metal, the second conductive layer has a data line and a drain electrode partially disposed on the first semiconductor electrode, the data line having a first protruded portion partially overlapped with the second semiconductor electrode and the first floating metal, and a second protruded portion partially overlapped with the third semiconductor electrode and the second floating metal, the drain electrode having a first protruded portion partially overlapped with the second semiconductor electrode and the first floating metal and a second protruded portion partially overlapped with the third semiconductor electrode and the second floating metal;

the method comprising irradiating laser beams to the first protruded portion of the data line and the second protruded portion of the drain electrode from a lower surface side of the substrate to electrically connect the data line and the first floating metal and electrically connect the drain electrode and the second floating metal.

* * * * *